(12) United States Patent
Fulford et al.

(10) Patent No.: US 12,727,244 B2
(45) Date of Patent: Sep. 1, 2026

(54) METHOD OF MANUFACTURING A GATE-ALL-AROUND TRANSISTOR USING SUPPORT CANTILEVERS ON OPPOSING ENDS OF A MULTILAYERED STACK

(71) Applicant: Tokyo Electron Limited, Tokyo (JP)

(72) Inventors: H. Jim Fulford, Marianna, FL (US); Mark I. Gardner, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 727 days.

(21) Appl. No.: 18/182,066

(22) Filed: Mar. 10, 2023

(65) Prior Publication Data

US 2024/0304701 A1 Sep. 12, 2024

(51) Int. Cl.

| | |
|---|---|
| ***H10D 86/01*** | (2026.01) |
| ***H10D 30/01*** | (2025.01) |
| ***H10D 30/43*** | (2025.01) |
| ***H10D 30/67*** | (2025.01) |
| ***H10D 64/01*** | (2025.01) |

(52) U.S. Cl.
CPC ....... *H10D 86/0221* (2025.01); *H10D 30/014* (2025.01); *H10D 30/031* (2025.01); *H10D 30/43* (2025.01); *H10D 64/015* (2025.01); *H10D 64/017* (2025.01); *H10D 64/018* (2025.01); *H10D 30/6735* (2025.01)

(58) Field of Classification Search
CPC ........................ H10D 86/0221; H10D 84/0147
See application file for complete search history.

(56) References Cited

U.S. PATENT DOCUMENTS

| | | | | |
|---|---|---|---|---|
| 10,332,986 | B2 * | 6/2019 | Bi | B82Y 10/00 |
| 2016/0111494 | A1 * | 4/2016 | Cheng | H10D 62/121 438/151 |
| 2020/0373411 | A1 * | 11/2020 | Lee | H10D 64/017 |
| 2021/0135016 | A1 * | 5/2021 | Wan | H10D 30/6757 |

* cited by examiner

*Primary Examiner* — William B Partridge
*Assistant Examiner* — Dmitri Mihaliov
(74) *Attorney, Agent, or Firm* — Oblon, McClelland, Maier & Neustadt, L.L.P.

(57) ABSTRACT

A method of fabricating a semiconductor device includes forming on a patterned multilayered stack including sacrificial layers alternatingly stacked with channel layers on a substrate, the patterned multilayered stack having opposing sidewalls and opposing ends. Cantilever supports are formed on the substrate, each cantilever support being in contact with a respective opposing end of the patterned multilayered stack. A gate-all-around (GAA) structure is formed around each channel layer while the opposing ends of the multilayered stack are supported by the cantilever supports. The cantilever supports are removed from the opposing ends of the patterned multilayered stack to expose end portions of each channel layer, and source-drain (S-D) regions are formed on the exposed end portions of each respective channel layer.

18 Claims, 6 Drawing Sheets

METHOD OF MANUFACTURING A GATE-ALL-AROUND TRANSISTOR USING SUPPORT CANTILEVERS ON OPPOSING ENDS OF A MULTILAYERED STACK

FIELD OF THE INVENTION

The present disclosure generally relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

SUMMARY

The present disclosure is directed towards a semiconductor device and a method to fabricate a semiconductor device.

Aspect (1) provides a method of fabricating a semiconductor device, including: forming on a patterned multilayered stack including sacrificial layers alternatingly stacked with channel layers on a substrate, the patterned multilayered stack having opposing sidewalls and opposing ends, and forming cantilever supports on the substrate, each cantilever support being in contact with a respective opposing end of the patterned multilayered stack. A gate-all-around (GAA) structure is formed around each channel layer while the opposing ends of the multilayered stack are supported by the cantilever supports. The cantilever supports are removed from the opposing ends of the patterned multilayered stack to expose end portions of each channel layer, and source-drain (S-D) regions are formed on the exposed end portions of each respective channel layer.

Aspect (2) includes the method of aspect (1), wherein the forming a patterned multilayered stack includes forming a plurality of alternatingly stacked channel layers.

Aspect (3) includes the method of aspect (1), wherein the forming a patterned multilayered stack includes epitaxially growing SiGe sacrificial layers and Si channel layers on the substrate.

Aspect (4) includes the method of aspect (1), wherein the forming a patterned multilayered stack further includes forming a dummy isolation layer on the substrate, the sacrificial layers alternatingly and channel layers being stacked on the on the dummy isolation layer.

Aspect (5) includes the method of aspect (1), wherein the forming a GAA structure includes: exposing opposing side surfaces of the patterned multilayered stack; selectively etching the sacrificial layers to expose side surfaces each channel layer while ends of the channel layer are supported and covered by the cantilever supports; and forming the GAA structure on the exposed side surfaces of each channel layer.

Aspect (6) includes the method of aspect (5), wherein the forming a GAA structure includes: depositing a gate dielectric on the exposed side surfaces of each channel layer; and depositing a gate conductor on the gate dielectric.

Aspect (7) includes the method of aspect (6), wherein the depositing a gate dielectric includes depositing a high-k layer on the exposed side surfaces of each channel layer.

Aspect (8) includes the method of aspect (6), wherein the depositing a gate conductor includes depositing a work function metal on the gate dielectric.

Aspect (9) includes the method of aspect (1), further including forming inner spacers to isolate each GAA structure from respective S-D regions.

Aspect (10) includes the method of aspect (9), wherein forming inner spacers includes: selectively etching an end portion of each GAA to form an etch indent; and filling the etch indent with dielectric material.

Aspect (11) includes the method of aspect (1), wherein the removing the cantilever supports includes etching the cantilever supports and a portion of the opposing ends of the patterned multilayered stack to expose ends of each channel layer and ends of the GAA structure formed around the respective channel layer.

Aspect (12) includes the method of aspect (1), wherein the forming S-D regions includes epitaxially growing doped semiconductor material from exposed ends of each channel layer to form S-D regions.

Aspect (13) includes the method of aspect (1), wherein the epitaxially growing doped semiconductor material includes forming one of n-doped and p-doped S-D regions.

An aspect (14) includes a method of fabricating a gate-all-around (GAA) transistor, including: forming a nanosheet stack of alternating SiGe and Si nanosheets on a substrate, wherein the nanosheet stack has opposing ends contacting cantilever supports, and forming a gate structure all around each Si nanosheet while ends of each Si nanosheet are supported by the cantilever supports. End portions of the gate structure are replaced with a dielectric material to form inner spacers for the GAA transistor, and source-drain (S-D) regions are formed on the ends of each Si nanosheet such that each S-D region is isolated from the gate structure by a respective inner space.

Aspect (15) includes the method of aspect (14), wherein the forming a gate structure includes etching the SiGe nanosheets to release the Si nanosheets while the cantilever supports support opposing ends of each Si nanosheet.

Aspect (16) includes the method of aspect (15), wherein the forming a gate structure further includes depositing a gate dielectric layer around the released Si nanosheets while the cantilever supports support opposing ends of each Si nanosheet.

Aspect (17) includes the method of aspect (16), wherein the forming a gate structure further includes depositing a gate conductor around the gate dielectric layer while the cantilever supports support opposing ends of each Si nanosheet.

Aspect (18) includes the method of aspect (17), wherein the replacing end portions of the gate structure includes: removing the cantilever supports to expose ends of each Si nanosheet and ends of a respective gate structure formed on the Si nanosheet; selectively etching an indent at each end of the gate conductor; and depositing dielectric material in each indent to form the inner spacers for the GAA transistor.

Aspect (19) includes the method of aspect (18), wherein the forming S-D regions includes epitaxially growing doped Si on the ends of each Si nanosheet.

Aspect (20) includes the method of aspect (19), wherein the forming S-D regions includes epitaxially growing n-doped Si or p-doped Si on the ends of each Si nanosheet.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1A:
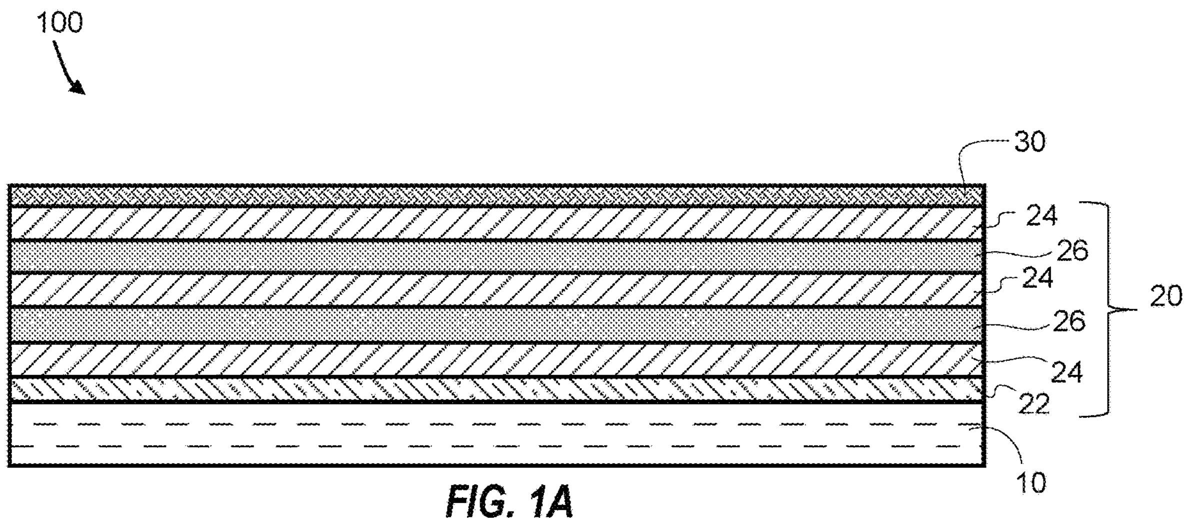
FIG. 1A is a sectional view of an intermediate structure in a process for manufacturing a semiconductor device in accordance with an example embodiment of the disclosed invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Techniques for 3D cantilever nanosheet formation are disclosed which enable robust 3D transistor architectures with process flows for side-by-side transistors and stacked CFET flows. With 3D cantilever nanosheet formation, the entire channel with a GAA structure is completed prior to source-drain (S-D) formation. The cantilever support allows longer nanosheets to be made. Further, using a dielectric material for the cantilever material enables a dual role of the cantilever to also provide isolation between adjacent devices and/or device stacks. The cantilever allows for straight 3D nano planes of N tall devices.

FIG. 1A illustrates a structure 100 in which an initial stack is formed on a substrate 10. FIG. 1A is a side section view of the structure 100. The initial stack includes a stack of semiconductor layers 20 and a protective cap layer 30 provided in sequence on the substrate 10. In the example embodiment of FIG. 1A, the stack of semiconductor layers 20 includes a layer of epitaxially grown first semiconductor material 22 (epi-1) provided on top of substrate 10, followed by alternating layers of epitaxially grown second semiconductor material 24 (epi-2) and third semiconductor material 26 (epi-3). In the example embodiment of FIG. 1A, the alternating sequence is performed two times to provide a stack of two transistors as described further below. A layer of protective cap material 30 is formed on the stack of semiconductor layers 20. In the example embodiment, the epi-1 layer 22, epi-2 layer 24 and epi-3 layer 26 are different compositions of semiconductor material that are capable of selective etch relative to each other. The epi-3 layers 26 provide active material for forming the channel and source-drain (S-D) of a transistor, while the epi-1 layer 22 and epi-2 layers 24 provide sacrificial material used for forming other elements such as the gate of the transistors, isolation structures etc. In one example, the epi-1 material may be SiGe65, the epi-2 material may be SiGe and the epi-3 material may be Si. The protective cap layer 30 is a insulative or dielectric material such as a protective oxide, a nitride hard mask etc.

Figure 1B:
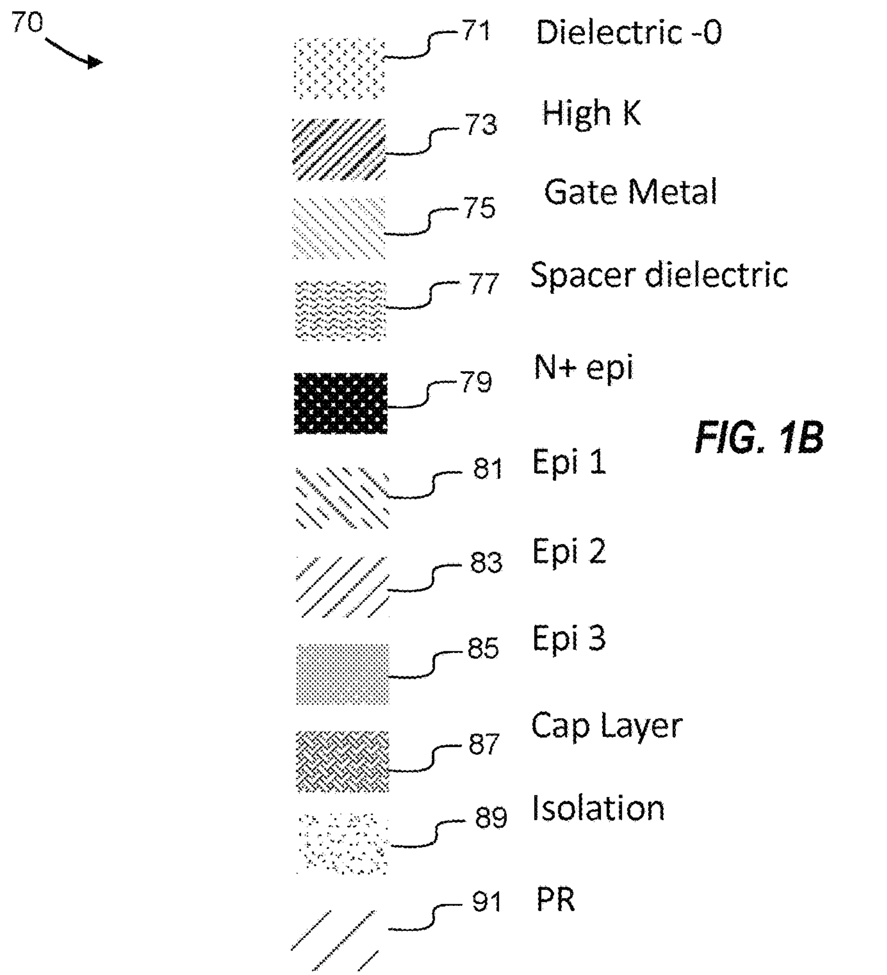
FIG. 1B is a materials legend for the drawings.

The example materials of FIG. 1A are depicted throughout the drawings by way of material patterns shown in the legend 70 of FIG. 1B. In the legend, pattern 71 is dielectric −0, pattern 73 is high-K material, pattern 75 is gate metal, pattern 77 is spacer dielectric, pattern 79 is n+ epi semiconductor material, pattern 81 is epi-1 material, pattern 83 is epi-2 material, pattern 85 is epi-3 material, pattern 87 is cap layer material, pattern 89 is isolation material, and 91 is a photoresist mask material.

Figure 2:
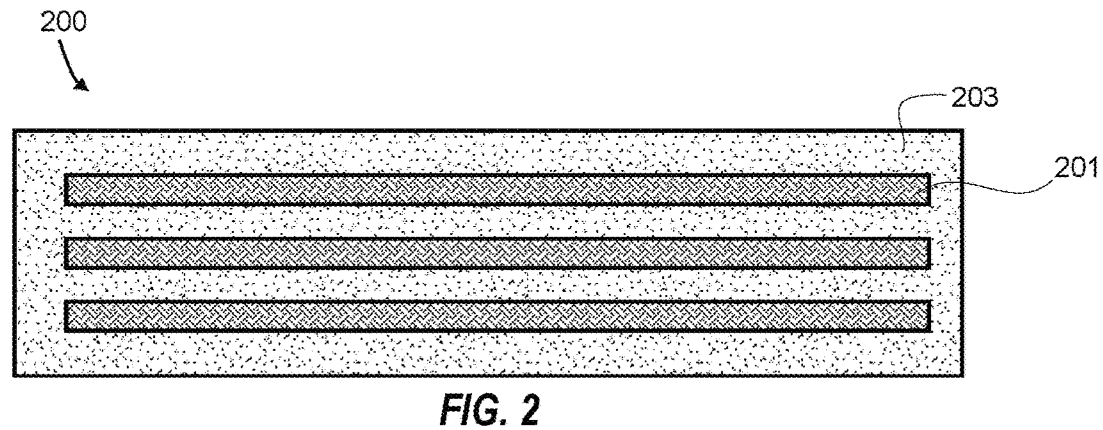
FIG. 2 is a top plane view of an intermediate structure in a process for manufacturing a semiconductor device in accordance with an example embodiment of the disclosed invention.

FIG. 2 shows a structure 200 after pattern etching the initial stack to form row stacks. FIG. 2 is a top plane view of the structure 200. In one example, a photoresist mask is used to etch the initial stack such that row stacks 201 of the layers described in FIG. 1A are provided. A fill 203 of isolation material 89 is filled in the etched regions to provide the structure 200 as shown.

Figure 3A:
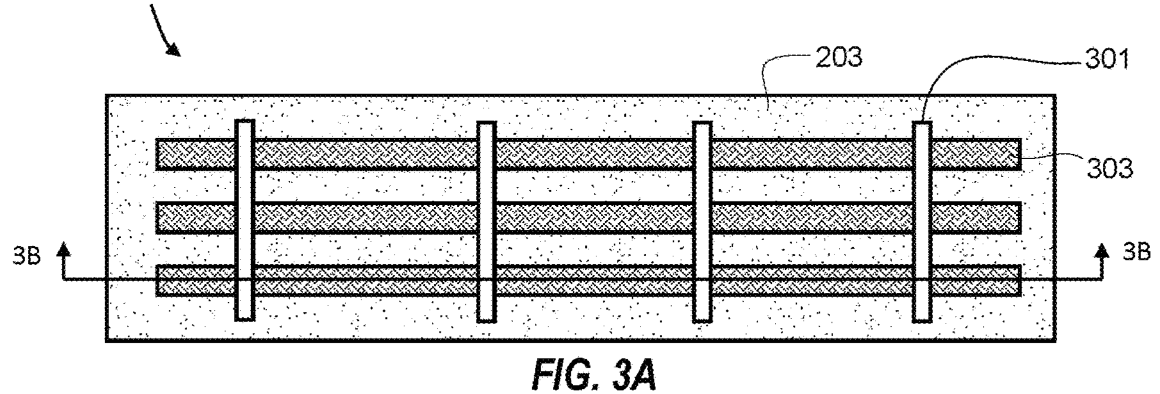
FIG. 3A is a top plane view of an intermediate structure in a process for manufacturing a semiconductor device.
Figure 3B:
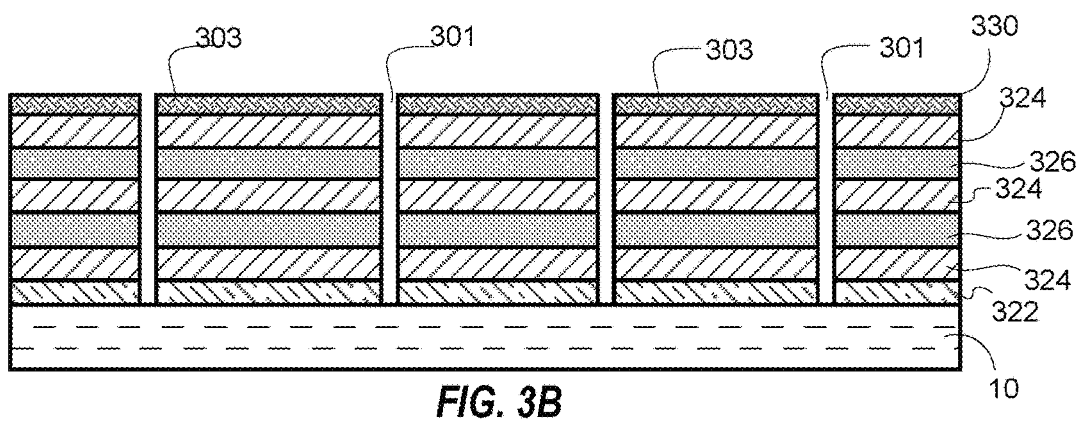
FIG. 3B is sectional view of the intermediate structure in accordance with an example embodiment of the disclosed invention.

FIGS. 3A and 3B show a structure 300 after segmenting the row stacks into individual stacks. FIG. 3A is a top plane view of the structure 300, and FIG. 3B is a side cross-section of the structure 300 at the section line 3B-3B shown in FIG. 3A. This convention of providing section line labels that correspond to the figure number of the associated section view is used throughout this disclosure. In one example, a photoresist mask is used to etch openings 301 that segment the row stacks 201 into individual stacks 303. As shown in FIG. 3B, the openings 301 extend through the initial stack to the substrate 10 such that the individual stacks 303 provide sheets or nanosheets of the stacked materials described in FIG. 1. In the example shown, each individual stack 303 includes nanosheet 322 of epi-1 material 81, nanosheets 324 of epi-2 material 83, nanosheets 326 of eppi-3 material 85 and a cap 330 on each individual stack 303. The individual stacks 303 will each provide vertically stacked transistors as described below.

Figure 4A:
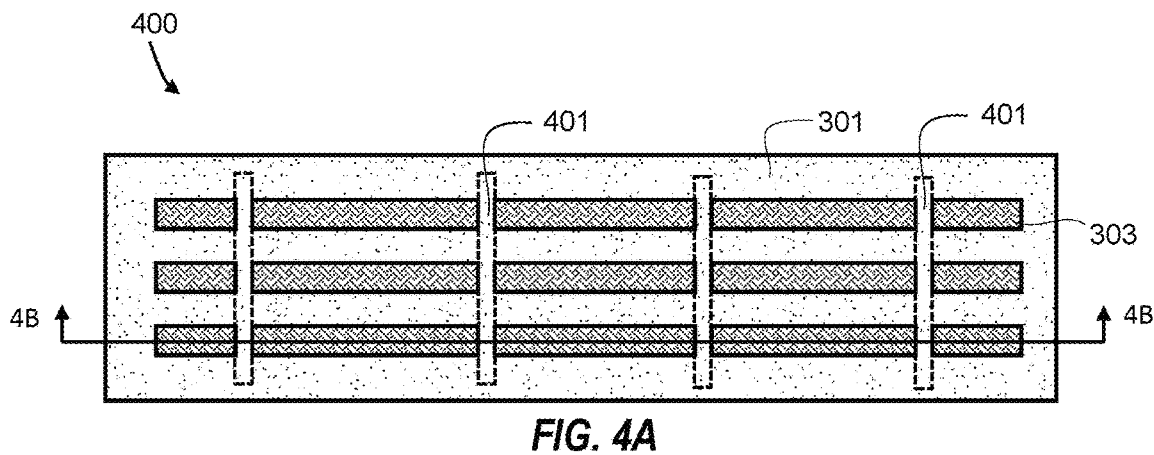
FIG. 4A is a top plane view of an intermediate structure in a process for manufacturing a semiconductor device.
Figure 4B:
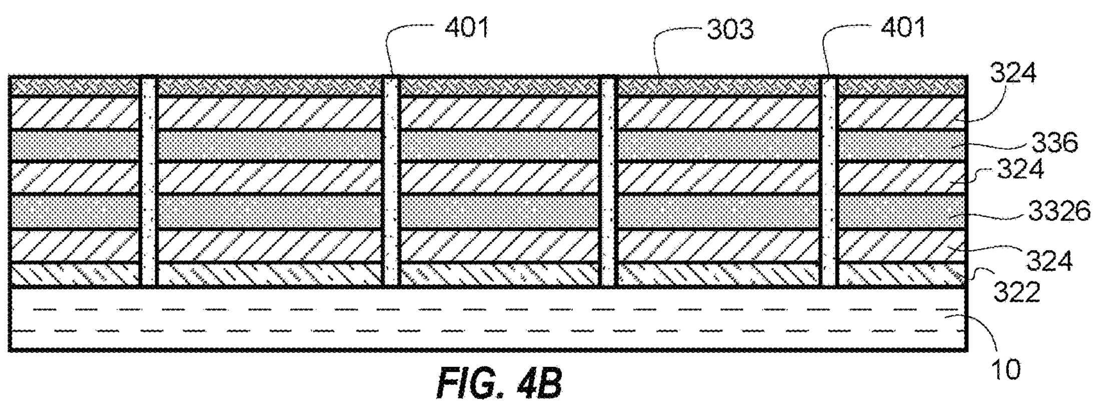
FIG. 4B is sectional view of the intermediate structure in accordance with an example embodiment of the disclosed invention.

FIGS. 4A and 4B show a structure 400 after filling the etch openings with additional dielectric material to form cantilever 3D nanosheet supports. FIG. 4A is a top plane view of the structure 400, and FIG. 4B is a side cross-section of the structure at the section line 4B-4B. In an example, the openings 301 are filled with isolation material 89 to form cantilevers 401 which support the nanosheets of the individual stacks during subsequent processing. The boundary of the newly added cantilevers 401 are shown by a dashed line in FIG. 4A.

Figure 5:
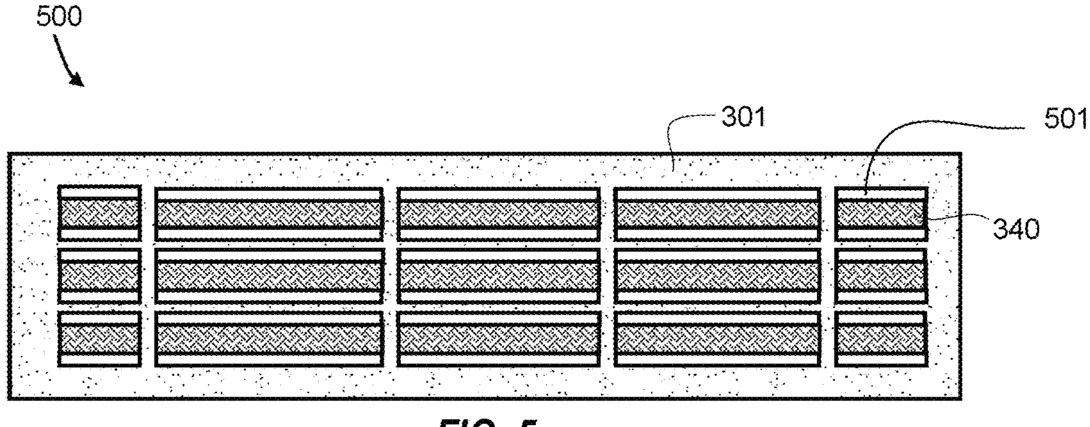
FIG. 5 is a top plane view of an intermediate structure in a process for manufacturing a semiconductor device in accordance with an example embodiment of the disclosed invention.

FIG. 5 shows a structure 500 after forming openings 501 to enable forming substrate isolation and gate-all-around structures. In one example process, a photoresist gate mask is used to etch openings 501 in the dielectric 301 directionally down to the substrate 10. The openings 501 expose sides of the patterned individual stacks 303.

Figure 6:
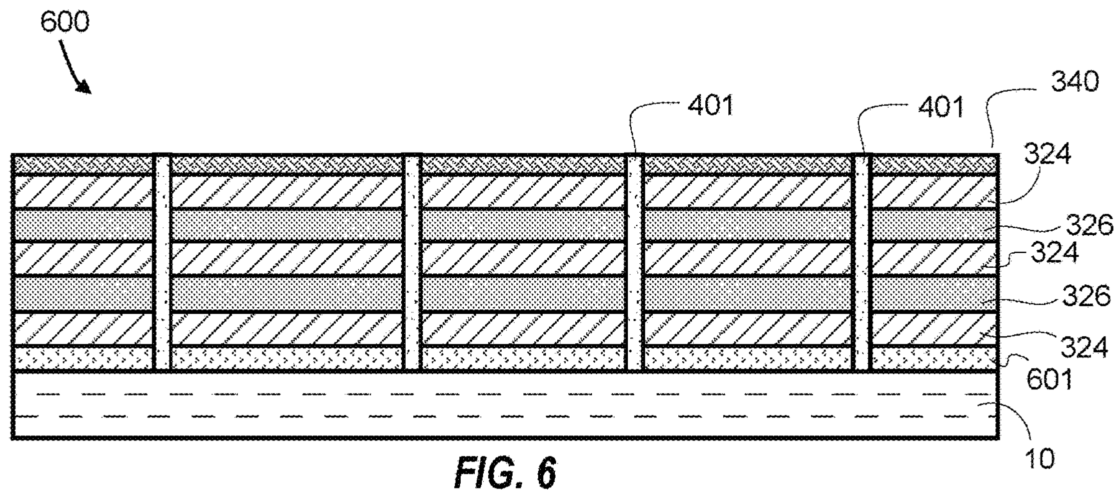
FIG. 6 is a sectional view of an intermediate structure in a process for manufacturing a semiconductor device in accordance with an example embodiment of the disclosed invention.

FIG. 6 shows a structure 600 after providing the substrate isolation structure. In one example, the sacrificial nanosheet 322 of epi-1 material 81 is selectively etched and replaced by isolation dielectric material 71. The isolation dielectric material 71 is then directionally etched with alignment to the cap 340 to form the substrate isolation structures 601 expose sides of each individual stack as described in FIG. 5.

Channel release is then performed, and high-k and gate metal steps are performed before forming source-drain (S-D) regions.

Figure 7:
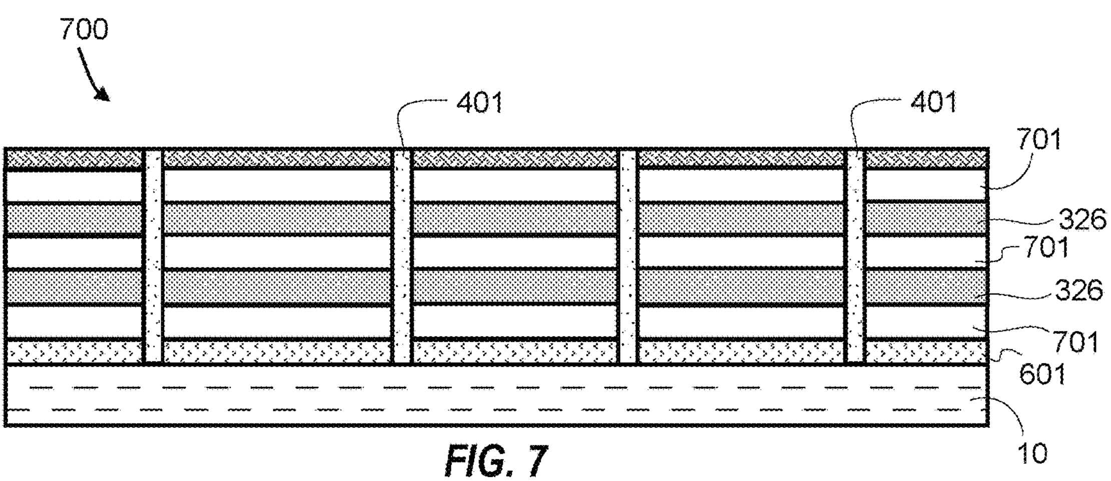
FIG. 7 is sectional view of an intermediate structure in a process for manufacturing a semiconductor device in accordance with an example embodiment of the disclosed invention.
Figure 8:
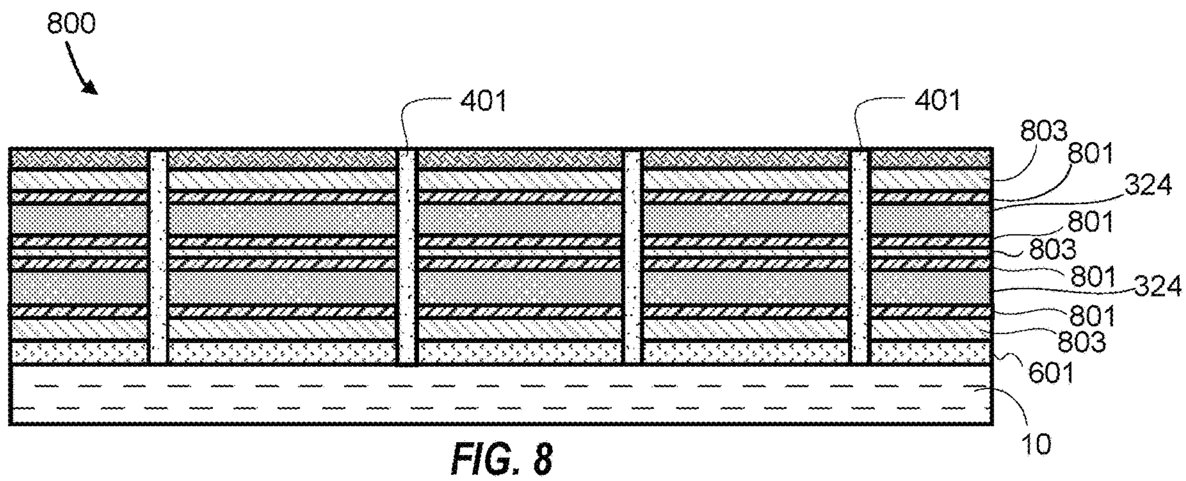
FIG. 8 is a sectional view of the intermediate structure in a process for manufacturing a semiconductor device in accordance with an example embodiment of the disclosed invention.

FIG. 7 shows a structure 700 after release of the channels in each of the individual stacks. In one example, the nanosheets 324 of epi-2 material 83 are etched to form openings 701 which expose the nanosheets 326 of epi-3 material which will for the channel of the transistors. FIG. 8 shows a structure 800 after formation of the gate-all-around (GAA) structure of the transistors. First, a layer of gate dielectric material is deposited in the opening 701 on the epi-3 material 85 to form gate dielectric 801. In one example, atomic layer deposition (ALD) is used to deposit high-K dielectric layer 73 as the gate dielectric 801. A fill of gate metal material 75 is then deposited in the opening 701 and on the gate dielectric 801 to form the gate conductor 803 and complete the GAA structure as shown.

Figure 9:
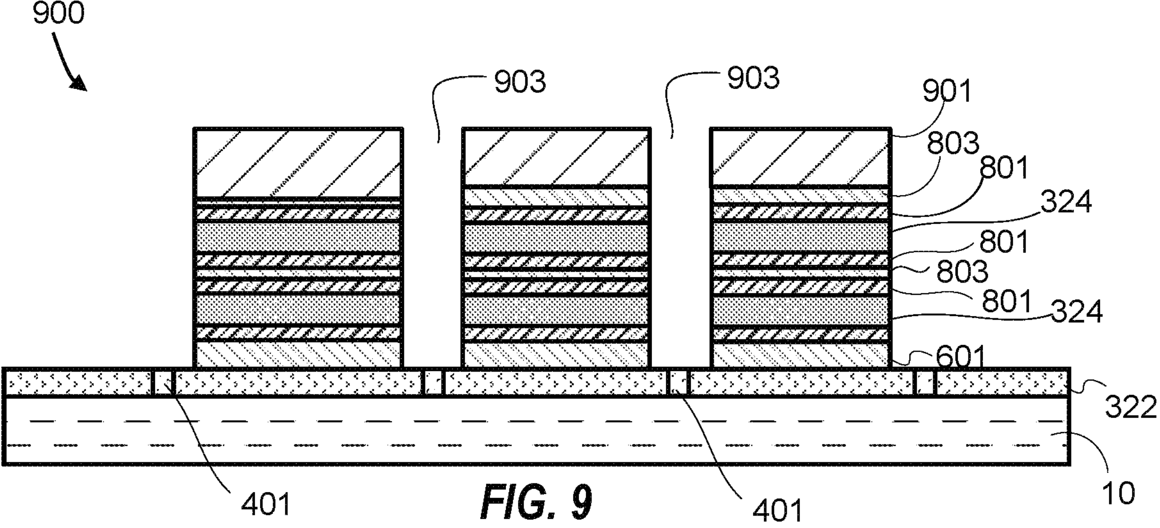
FIG. 9 is a sectional view of an intermediate structure in a process for manufacturing a semiconductor device in accordance with an example embodiment of the disclosed invention.

FIG. 9 shows a structure 900 after opening exposing ends of the active material for forming source-drain S-D regions. In the embodiment shown, photoresist mask 901 is provided on the structure and a directional etch is performed to etch openings that remove a portion of each individual stack and each cantilever 401. As shown, the openings are etched down to the substrate 10 to expose end portions of active nanosheets 324 for forming S-D regions. Portions of each cantilever 401 remain as part of the substrate isolation.

Figure 10:
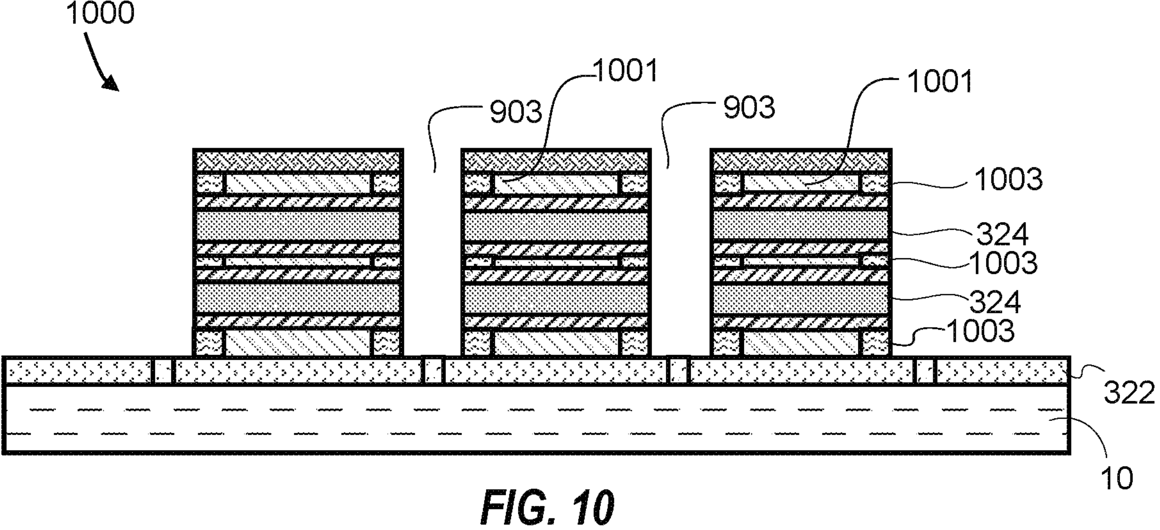
FIG. 10 is a sectional view of the intermediate structure in a process for manufacturing a semiconductor device in accordance with an example embodiment of the disclosed invention.

FIG. 10 shows a structure 1000 after forming inner spacers for the transistors. In the example shown, selective etch is performed to indent the gate metal and provide the gate metal contact region 1001. Spacer dielectric material is then deposited to fill the voids created by the metal indent etch thereby providing the spacers 1003.

Figure 11:
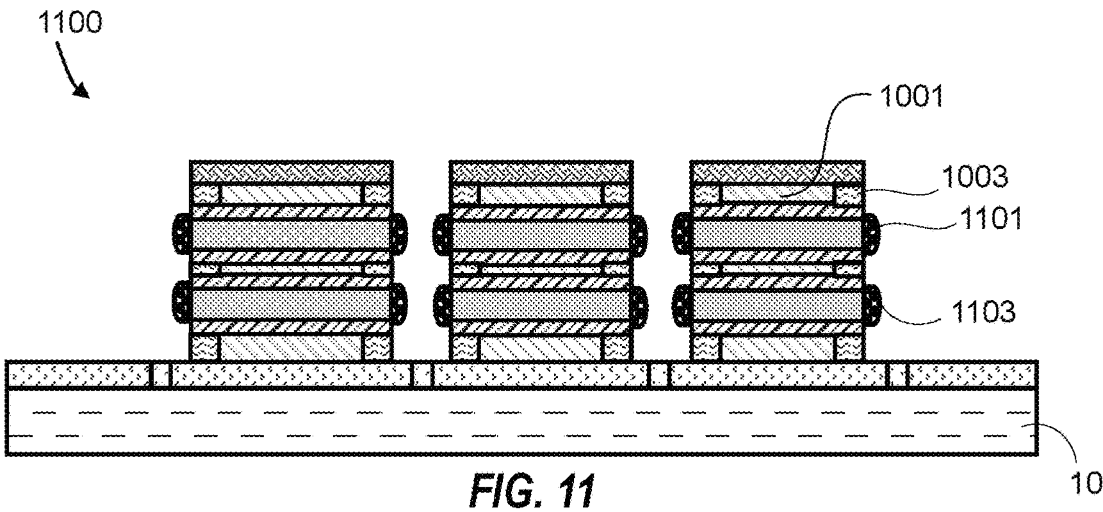
FIG. 11 is a sectional view of an intermediate structure in a process for manufacturing a semiconductor device in accordance with an example embodiment of the disclosed invention.
Figure 12:
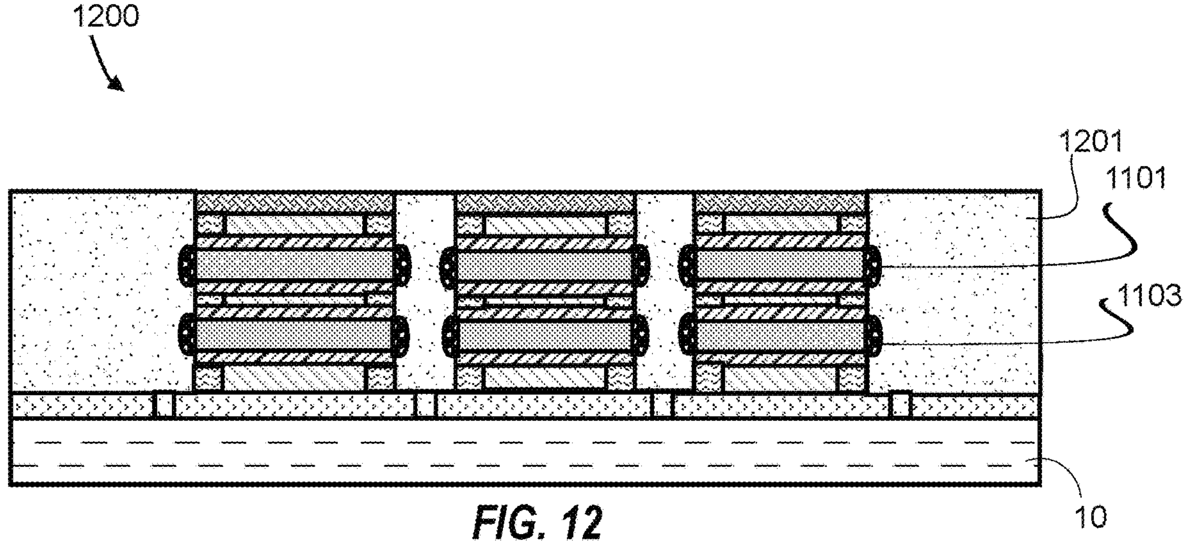
FIG. 12 is a sectional view of an intermediate structure in a process for manufacturing a semiconductor device in accordance with an example embodiment of the disclosed invention.

FIG. 11 shows a structure 1100 after forming the source-drain S-D regions for the transistors. In the example embodiment, the exposed ends of the channels 324 serves as a seed for epitaxial growth of upper S-D regions 1101 for the upper transistor in each individual stack, and lower S-D regions 1103. In the example of FIG. 11, the S-D regions 1101 and 1103 are n+ doped semiconductor material the lower transistor in each individual stack. In some alternative embodiments, p+ doping is performed. Formation of the S-D regions completes the basic elements for the transistors in each individual stack. In the example embodiment described, two transistors are provided in each individual stack, with each transistor having a single channel formed by a single layer of active material. However, each stack may include any number of stacked transistors, and each transistor may include a channel formed of any number of layers of active material. FIG. 12 shows a structure 1200 after depositing a fill dielectric 1201 to isolation the transistor stacks from each other.

Techniques disclosed herein include methods for cantilever formation of 3D devices. The semiconductor layers may be made from semiconductor materials such as Si, Ge, SiGe, GaAs, InAs, InP, semiconductive behaving oxide (e.g. $In_2O_3$, $SnO_2$, InGaZnO, and ZnO, SnO), 2D material (e.g. $WS_2$, $WSe_2$, $Wte_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, etc.) or any other suitable semiconductor material in monocrystalline and/or polycrystalline form. Further, the S-D regions may be doped with either p-type or n-type dopants at various doping concentration levels. The p-type dopant may be boron and the n-type dopant may be phosphorus or arsenic, however other suitable dopant materials may be used. Various techniques may be used to provide a strained channel material to improve carrier mobility, for example.

The doped S-D regions may also be made from any semiconductor material in monocrystalline or polycrystalline form and doped with either p-type or n-type dopants at various doping concentration levels. Various S-D contact engineering techniques known in the semiconductor fabrication art may be employed in the design and formation of S-D regions. For example, the S-D regions may include S-D extensions.

Insulation and dielectric layers may be implemented as a dielectric material such as SiO, SiN, SiON, SiC, SiOC, SiCN, SiOCN, the like, or a combination thereof. These structures may also be implemented as high-k dielectrics. The same or different dielectric materials can be used for these structures. Device contacts, connections vias and the like may be made of any conductive material, such as a doped polysilicon material or a metal such as W, Co, Ru, Cu, Al, the like, or combinations thereof. The same or different conductor materials can be used for these structures.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

The order of discussion of the different steps as described herein in reference to various fabrication methods have been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Various additional operations may be performed and/or described operations may be omitted in additional embodiments. Accordingly, the present invention can be embodied and viewed in many different ways.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

What is claimed is:

1. A method of fabricating a semiconductor device, comprising:

forming a patterned multilayered stack comprising sacrificial layers alternatingly stacked with channel layers on a substrate, the patterned multilayered stack having opposing sidewalls and opposing ends;

forming cantilever supports on the substrate, each cantilever support being in contact with a respective opposing end of the patterned multilayered stack;

forming a gate-all-around (GAA) structure around each channel layer while the opposing ends of the multilayered stack are supported by the cantilever supports;

removing the cantilever supports from the opposing ends of the patterned multilayered stack to expose end portions of each channel layer; and forming source-drain (S-D) regions on the exposed end portions of each respective channel layer, wherein the removing the cantilever supports comprises etching the cantilever supports and a portion of the opposing ends of the patterned multilayered stack to expose ends of each channel layer and ends of the GAA structure formed around the respective channel layer, with the ends of the GAA structure being aligned with the ends of the channel layers.

2. The method of claim 1, wherein the forming a patterned multilayered stack comprises epitaxially growing SiGe sacrificial layers and Si channel layers on the substrate.

3. The method of claim 1, wherein the forming a patterned multilayered stack further comprises forming a dummy isolation layer on the substrate, the sacrificial layers and channel layers being alternatingly stacked on the dummy isolation layer.

4. The method of claim 1, wherein the forming a GAA structure comprises:

exposing opposing sidewalls of the patterned multilayered stack;

selectively etching the sacrificial layers to expose side surfaces of each channel layer while ends of the channel layer are supported and covered by the cantilever supports; and forming the GAA structure on the exposed side surfaces of each channel layer.

5. The method of claim 4, wherein the forming a GAA structure comprises:

depositing a gate dielectric on the exposed side surfaces of each channel layer; and depositing a gate conductor on the gate dielectric.

6. The method of claim 5, wherein the depositing a gate dielectric comprises depositing a high-k layer on the exposed side surfaces of each channel layer.

7. The method of claim 5, wherein the depositing a gate conductor comprises depositing a work function metal on the gate dielectric.

8. The method of claim 1, further comprising forming inner spacers to isolate each GAA structure from respective S-D regions.

9. The method of claim 8, wherein forming inner spacers comprises:

selectively etching an end portion of each GAA to form an etch indent; and filling the etch indent with dielectric material.

10. The method of claim 1, wherein the forming S-D regions comprises epitaxially growing doped semiconductor material from exposed ends of each channel layer to form S-D regions.

11. The method of claim 10, wherein the epitaxially growing doped semiconductor material comprises forming one of n-doped and p-doped S-D regions.

12. A method of fabricating a gate-all-around (GAA) transistor, comprising:

forming a nanosheet stack of alternating SiGe and Si nanosheets on a substrate, wherein the nanosheet stack has opposing ends contacting cantilever supports;

forming a gate structure all around each Si nanosheet while ends of each Si nanosheet are supported by the cantilever supports;

replacing end portions of the gate structure with a dielectric material to form inner spacers for the GAA transistor; and forming source-drain (S-D) regions on the ends of each Si nanosheet such that each S-D region is isolated from the gate structure by a respective inner space, wherein the replacing end portions of the gate structure comprises:

removing the cantilever supports and a portion of the opposing ends of the nanosheet stack to expose ends of each Si nanosheet and ends of a respective gate structure formed on the Si nanosheet, with the ends of the Si nanosheets being aligned with the ends of the gate structures.

13. The method of claim 12, wherein the forming a gate structure comprises etching the SiGe nanosheets to release the Si nanosheets while the cantilever supports support opposing ends of each Si nanosheet.

14. The method of claim 13, wherein the forming a gate structure further comprises depositing a gate dielectric layer around the released Si nanosheets while the cantilever supports support opposing ends of each Si nanosheet.

15. The method of claim 14, wherein the forming a gate structure further comprises depositing a gate conductor around the gate dielectric layer while the cantilever supports support opposing ends of each Si nanosheet.

16. The method of claim 14, wherein the replacing end portions of the gate structure further comprises:

selectively etching an indent at each end of the gate structure; and depositing dielectric material in each indent to form the inner spacers for the GAA transistor.

17. The method of claim 16, wherein the forming S-D regions comprises epitaxially growing doped Si on the ends of each Si nanosheet.

18. The method of claim 17, wherein the forming S-D regions comprises epitaxially growing n-doped Si or p-doped Si on the ends of each Si nanosheet.

* * * * *